United States Patent
Hiblot et al.

(10) Patent No.: US 10,811,315 B2
(45) Date of Patent: Oct. 20, 2020

(54) METHOD FOR PRODUCING A THROUGH SEMICONDUCTOR VIA CONNECTION

(71) Applicant: IMEC vzw, Leuven (BE)

(72) Inventors: Gaspard Hiblot, Heverlee (BE); Stefaan Van Huylenbroeck, Kessel-Lo (BE); Geert Van der Plas, Leuven (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/456,833

(22) Filed: Jun. 28, 2019

(65) Prior Publication Data
US 2020/0006142 A1    Jan. 2, 2020

(30) Foreign Application Priority Data

Jul. 2, 2018 (EP) ..................... 18181104

(51) Int. Cl.
*H01L 21/768* (2006.01)
*H01L 21/8238* (2006.01)
(Continued)

(52) U.S. Cl.
CPC .. *H01L 21/76898* (2013.01); *H01L 21/76831* (2013.01); *H01L 21/823871* (2013.01);
(Continued)

(58) Field of Classification Search
CPC ............. H01L 21/76898; H01L 23/481; H01L 23/5384; H01L 25/0657;
(Continued)

(56) References Cited

U.S. PATENT DOCUMENTS

2002/0020862 A1    2/2002 Livengood et al.
2006/0121690 A1*  6/2006 Pogge ................... H01L 23/481
                                              438/455
(Continued)

FOREIGN PATENT DOCUMENTS

EP          3 324 436 A1     5/2018

OTHER PUBLICATIONS

Extended European Search Report dated Nov. 28, 2018 in European Patent Application No. 18181104.3.

*Primary Examiner* — Matthew E Warren
(74) *Attorney, Agent, or Firm* — Knobbe Martens Olson & Bear LLP

(57) ABSTRACT

A method of producing a through semiconductor via (TSV) connection is disclosed. In one aspect, an opening of the TSV is produced for contacting a first semiconductor die bonded to a second die or to a temporary carrier. The first die includes fin-shaped devices in the front end of line of the die. Etching of the TSV opening does not end on a metal pad, but the opening is etched until reaching a well that is formed of material of a first doping type and formed in the first die amid semiconductor material of a second doping type opposite the first. After filling the TSV opening with a conductive material, the TSV connects to a conductor of an intermediate metallization (IM) of the first die through at least one fin extending from the well and connected to the conductor. A package of dies comprising at least one TSV produced by the above method is also disclosed.

15 Claims, 4 Drawing Sheets

(51) Int. Cl.
  *H01L 27/092* (2006.01)
  *H01L 25/065* (2006.01)
  *H01L 23/538* (2006.01)
  *H01L 23/48* (2006.01)
  *H01L 23/00* (2006.01)

(52) U.S. Cl.
  CPC ........ *H01L 23/481* (2013.01); *H01L 23/5384* (2013.01); *H01L 24/32* (2013.01); *H01L 25/0657* (2013.01); *H01L 27/0924* (2013.01); *H01L 2224/29078* (2013.01); *H01L 2224/32145* (2013.01); *H01L 2225/06541* (2013.01); *H01L 2225/06544* (2013.01); *H01L 2225/06548* (2013.01)

(58) Field of Classification Search
  CPC . H01L 2225/06541; H01L 2225/06544; H01L 2225/06548
  USPC .................................. 257/621, 698; 438/455
  See application file for complete search history.

(56) References Cited

U.S. PATENT DOCUMENTS

| | | | |
|---|---|---|---|
| 2007/0090490 A1* | 4/2007 | Chang | H01L 23/481 257/621 |
| 2010/0078770 A1* | 4/2010 | Purushothaman | H01L 24/73 257/621 |
| 2010/0176506 A1* | 7/2010 | Hsu | H01L 25/0657 257/698 |
| 2011/0089572 A1 | 4/2011 | Tezcan et al. | |
| 2012/0168935 A1* | 7/2012 | Huang | H01L 21/76224 257/737 |
| 2014/0030847 A1* | 1/2014 | Kotlanka | H01L 21/50 438/107 |
| 2014/0346651 A1 | 11/2014 | Xiang et al. | |
| 2015/0021773 A1* | 1/2015 | Lee | H01L 21/76843 257/751 |
| 2017/0358562 A1 | 12/2017 | Banna et al. | |
| 2018/0061766 A1 | 3/2018 | Goktepeli | |

\* cited by examiner

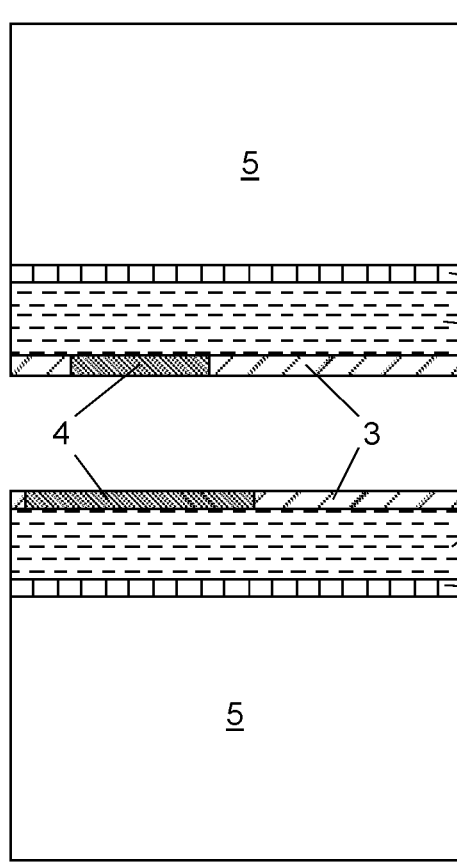
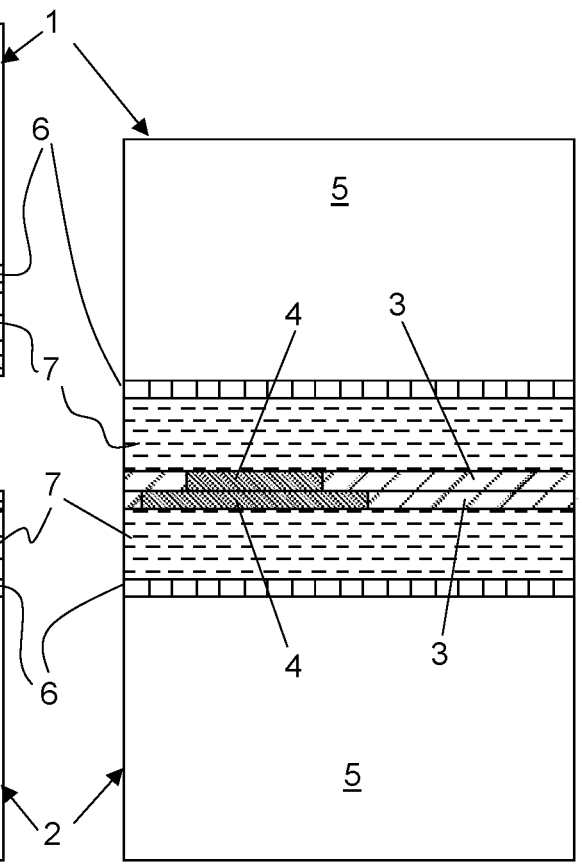
FIG. 1A
FIG. 1B
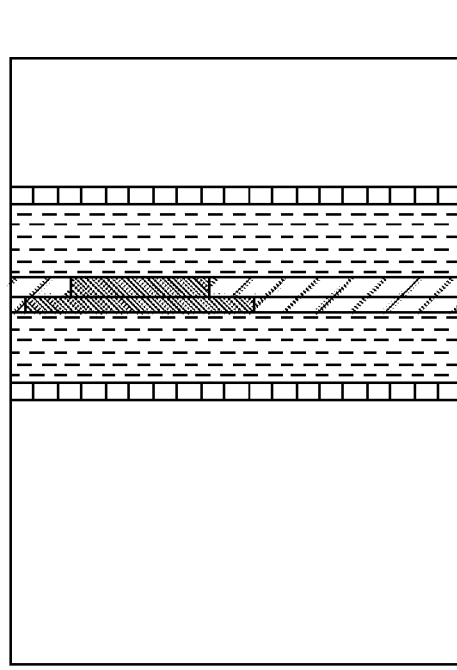
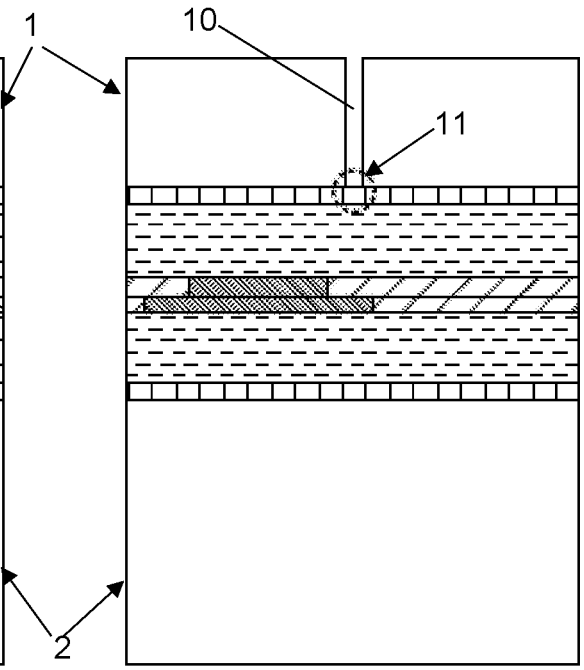
FIG. 1C
FIG. 1D

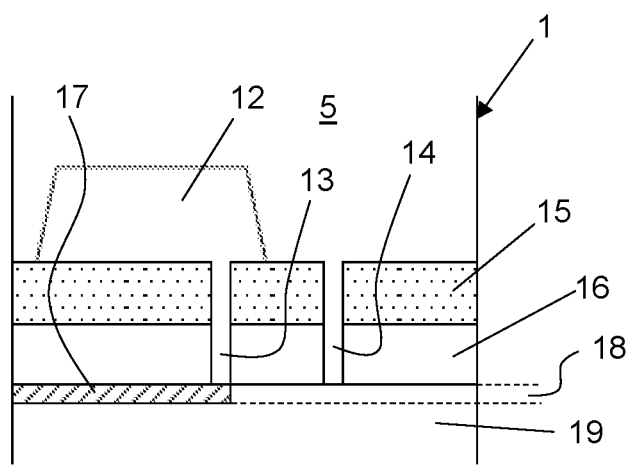
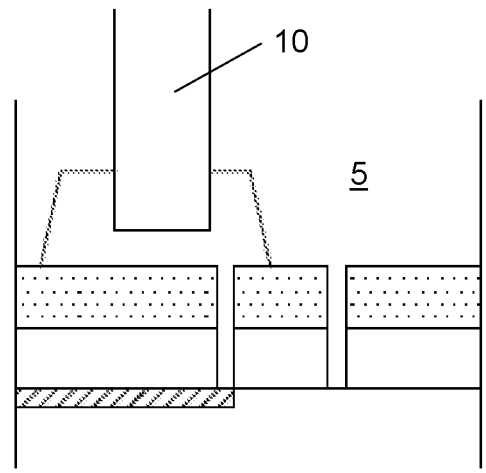
FIG. 2A
FIG. 2B
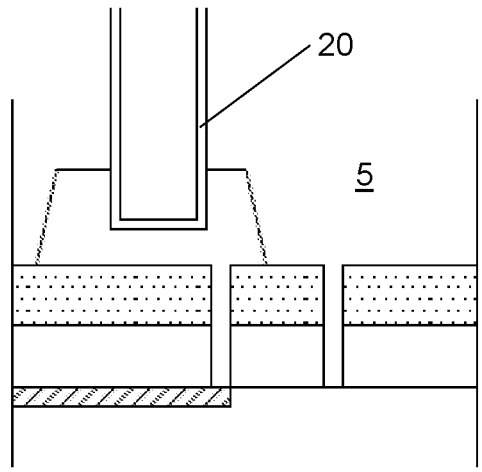
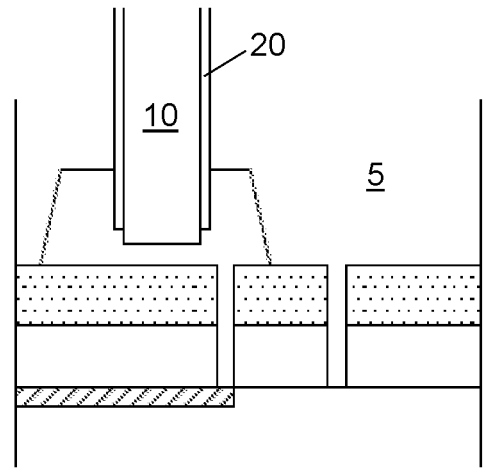
FIG. 2C
FIG. 2D
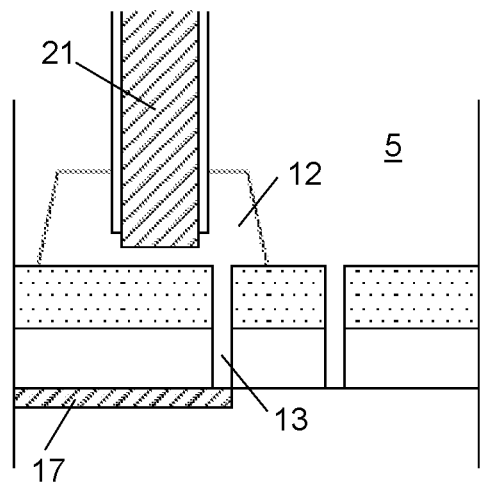
FIG. 2E

METHOD FOR PRODUCING A THROUGH SEMICONDUCTOR VIA CONNECTION

CROSS-REFERENCE TO RELATED APPLICATIONS

This application claims foreign priority to European Patent Application No. 18181104.3, filed Jul. 2, 2018, the contents of which are incorporated by reference herein in its entirety.

BACKGROUND

Technological Field

The disclosed technology is related to semiconductor processing, in particular to the production of through semiconductor via (TSV) connections which are now commonly applied in 3D integrated packages of interconnected semiconductor dies.

Description of the Related Technology

The via for a TSV connection may be produced after bonding of a first die to a second die and thinning the first die. The process includes lithography and deep anisotropic etching of an opening through the thinned die, and is followed by the deposition of a conformal dielectric liner in the opening, opening the liner at the bottom of the opening and filling the opening with metal. Possibly further steps may be performed before the metal fill, such as a barrier layer deposition. The second die is usually part of a larger substrate such as a standard semiconductor wafer onto which multiple "first dies" are bonded, either separately or equally as part of a larger first wafer that is bonded as whole to the second wafer. In current technology, TSV openings are etched until reaching a metal contact pad, usually a copper pad. One problem is that when multiple vias are etched simultaneously across a wafer, it is virtually unavoidable due to wafer thickness non-uniformity, that some of the vias are etched too far into the copper pads. This is the so-called "punch-through" effect, which causes copper sputtering and thereby a degradation of the via oxide reliability.

The above problem is particularly relevant for TSVs produced in a chip wherein the front end of line is mainly formed of fin-shaped devices. In planar (i.e., non-fin shaped) FEOL processing, the standard CMOS process can be used to produce a silicide area for the TSV etch to land on, the silicide area exhibiting higher selectivity for the etch process, so that the punch-through effect is mitigated. The creation of silicide areas in finFET processing is, however, not possible without a significant change in the process flow.

The etch process for creating the via opening and for opening the liner at the bottom of the opening is usually a plasma etch. When the TSV etch lands on a metal contact, the plasma is likely to charge the metal contact to a degree that is sufficient to cause breakdown of the thin gate dielectric of MOSFET transistors whose gate is coupled to the metal contact. This problem is known as plasma induced damage (PID). The traditional way of mitigating this problem is to include one or more PID-protection diodes in the vicinity of a TSV connection, which however increases the footprint of the TSV.

SUMMARY OF CERTAIN INVENTIVE ASPECTS

The disclosed technology aims to provide a solution to the above problems, in the case of a TSV designed for contacting a die comprising finFET type semiconductor devices in the front end of line. The aim is achieved by the method and the semiconductor package as described herein.

The disclosed technology is related to a method for producing a through semiconductor via (TSV) connection wherein the opening of the TSV is produced for contacting a first semiconductor die bonded to a second die or a temporary carrier. The first die includes fin-shaped devices in the front end of line of the die. The etching of the TSV opening does not end on a metal contact area, but the opening is etched until reaching a well that is formed of material of a first doping type and formed in the first die amid semiconductor material of a second doping type opposite the first. After filling the TSV opening with a conductive material, the TSV connects to a conductor of the intermediate metallization (IM) of the first die through at least one fin extending from the well and directly connected to the conductor. The disclosed technology is also related to a package of dies including at least one TSV produced by the above method.

As the TSV etch lands in a well, the problem of metal sputtering during etching is no longer encountered. The junction between the well and the surrounding oppositely doped material forms a PID protection diode, thereby obviating the need to include specifically designed PID protection diodes in the layout of the die. The use of a fin for establishing the connection between the TSV and the intermediate metallization is advantageous because a fin may be used for this purpose that is already part of the FEOL layout of the die.

The disclosed technology is in particular related to a method for producing a through semiconductor via (TSV) connection in a stack including a first semiconductor die and a second semiconductor die or a carrier substrate, the first die being bonded to the second die or to the carrier substrate. The first die includes a semiconductor substrate portion having a front side and a back side. On the front side of the substrate portion, at least one well of semiconductor material of a first doping type is implanted in an area of the substrate portion, the area being formed of semiconductor material of a second doping type opposite the first doping type. The first die also includes one or more fins of material of the first doping type extending outward from the well. The first die further includes a conductor that is electrically coupled to at least one of the one or more fins extending outward from the well. The method includes producing an opening for the TSV connection, and filling the opening with an electrically conductive material, characterized in that the opening is produced by an etching process that stops in the well of semiconductor material of the first type, so that after filling of the opening, an electrical connection is established from the TSV connection to the conductor, through the well and through the at least one fin.

According to an embodiment, the opening is etched through the backside of the substrate portion, after bonding the first die to the second die or to the carrier substrate.

According to another embodiment, the opening is etched after bonding the first die to the second die, and the opening is etched through the second die.

According to an embodiment, the method further includes: prior to filling the opening with a conductive material, producing a dielectric liner on the sidewalls of the opening, followed by: depositing a reactive material in the opening, enabling a reaction to take place between the reactive material and the semiconductor material in the well, so as to form at the bottom of the opening a portion of reacted material having higher conductivity than the material of the well prior to the reaction.

The disclosed technology is also related to a package of interconnected semiconductor dies, including at least one first die bonded to a second die. At least the first die of the package includes: a semiconductor substrate portion, at least one well of semiconductor material of a first doping type implanted in an area of the substrate portion, the area being formed of semiconductor material of a second doping type opposite the first doping type. The first die of the package also includes one or more fins of material of the first doping type extending outward from the well, at least one conductor that is electrically coupled to at least one of the one or more fins extending outward from the well. The package also includes one or more TSV connections for interconnecting the dies of the package, where at least one TSV connection ends in the well of the first die, so that the TSV connection is electrically connected to the conductor of the first die through the well and through the at least one fin.

According to an embodiment of the package according to the disclosed technology, the TSV connection is formed through the semiconductor substrate portion of the first die.

According to another embodiment of the package according to the disclosed technology, the TSV connection is formed through the second die.

The package according to the disclosed technology may include at the end of the TSV connection a portion of material having higher conductivity than the material of the well prior to the reaction.

BRIEF DESCRIPTION OF THE DRAWINGS

FIGS. 1A through 1D illustrate a bonding process of a first die to a second die, including thinning the first die and etching a TSV opening in the thinned die from the back side in accordance with an embodiment of the disclosed technology.

FIGS. 2A through 2E illustrate the process for forming a TSV connection in accordance with an embodiment of the disclosed technology.

DETAILED DESCRIPTION OF CERTAIN ILLUSTRATIVE EMBODIMENTS

Figure 3A:
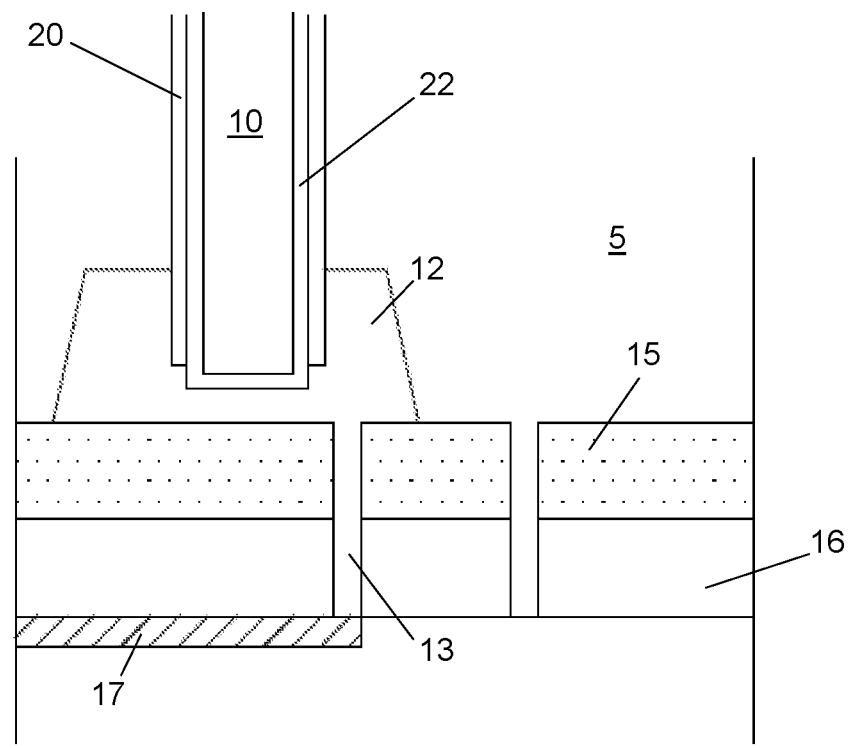
FIGS. 3A and 3B illustrate the formation of a silicide at the bottom of a TSV opening produced in accordance with an embodiment of the disclosed technology.

FIG. 1A illustrates the positioning of a first die 1 for bonding the die to a substrate including a second die 2. The second die 2 is part of a larger substrate or wafer. The first die 1 may be a separate component applied in a die-to-wafer bonding process, or it may be part of a larger substrate in a wafer-to-wafer bonding process. The bonding process is the so-called hybrid bonding: the two substrates are provided with a dielectric bonding layer 3, with metal contact areas 4 embedded therein. The first die is aligned to the second die so that bonding establishes an electric connection between contact areas 4 of the dies, as illustrated in FIG. 1B. The bond is realised by a thermal anneal, possibly combined with a compression force, wherein the dielectric bonding layers 3 undergo a chemical transformation that establishes a strong bond. The disclosed technology is not limited to these bonding processes. Any suitable bonding process known to a person skilled in the relevant technology can be implemented in embodiments of the disclosed technology and therefore are not described in detail here.

Both dies are formed of a semiconductor substrate portion 5 onto which a front end of line (FEOL) portion 6 and a back end of line (BEOL) portion 7 have been produced by CMOS processing. The FEOL portions 6 comprise fin-shaped active devices such as finFET transistors, produced on fin-shaped doped areas of the substrate portions 5. The BEOL portion 7 of each die is a stack of metallization layers, each layer comprising a pattern of metal conductors, referred to as metal levels M1, M2, etc., embedded in a dielectric material. The subsequent levels of the BEOL portion are interconnected through via connections. The bonding layers 3 are respectively on top of the BEOL portions 7 of the dies.

The transition (not shown) between a FEOL 6 and a BEOL portion 7 in each die 1 and 2 is formed by one or more metal levels which will be referred to in the present context as the intermediate metallization (IM). Another known terminology of this area is the Middle End Of Line (MEOL). This area is sometimes regarded as part of the FEOL. It is distinguished from the BEOL by a number of process parameters, such as the choice of the metal used (usually tungsten in IM and copper in BEOL, for example). The deepest of these IM levels includes metal conductive areas such as local interconnects that are electrically coupled to the fins in the FEOL portion.

After bonding, the first die 1 is thinned by a suitable process as illustrated in FIG. 1C. This can include a grinding step and/or a chemical mechanical polishing step, which can be suitably implemented by a person skilled in the relevant technology and are not described in detail here.

A TSV opening 10 is then produced from the backside of the first die 1 (FIG. 1D), by a lithography and plasma etch step and involving the deposition and patterning of a mask (not shown) on the upper surface of the thinned die 1. The TSV opening 10 lands (i.e., the etch process stops) in the vicinity of the FEOL portion 6 of the first die 1. The precise position of the TSV relative to the active devices in the FEOL 6 of the first die 1 is characteristic to the disclosed technology. This position is illustrated in detail in FIGS. 2A through 2E which are enlarged views of the area 11 indicated in FIG. 1D.

In non-limiting examples of the disclosed technology, the substrate portion 5 of the first die 1 is a p-doped silicon substrate portion. Other suitable substrate portions can be implemented. As shown in FIG. 2A, the thinned first die 1 includes an n-well 12 on the front side of the p-doped substrate portion 5, i.e., the n-well has an upper surface at the same level with the front surface of the substrate portion 5. One n-doped fin 13 is shown that extends out of the n-well 12, i.e., away from the front surface of the substrate portion 5. A second (p-doped) fin 14 is shown that extends out of the p-substrate portion 5 adjacent the n-well. This structure is described as an example that can be suitably implemented by a person skilled in the relevant technology; in CMOS finFET processing on a p-doped wafer, fins are produced in adjacent p-areas and n-areas. The n-doped areas are created by implanting dopants to thereby create n-wells. The fins are processed by lithography and etch methods, and by additional implant steps in order to adapt the doping level of the fins to the required functionality of the fins within the design of active devices on the die. An epitaxially grown conductive material and possibly a thin silicide layer (not shown) may additionally be produced on top of the fins in areas which are to serve as source or drain contacts. One single n-doped fin 13 is shown for the sake of simplicity, as well as one single p-doped fin 14 in the adjacent p-area. Normally however, arrays of multiple parallel fins are processed in each well/area. Transversally to the fins, localized gates and gate dielectrics are produced which are not shown in the drawings but would be understood by a person skilled in the relevant technology. The fins are isolated from neighboring fins by dielectric layers 15 and 16. In the common case of silicon-based technology, layer 15 is a silicon oxide referred to as "STI oxide" (shallow trench isolation) produced during FEOL processing. On top of the STI oxide is a further dielectric layer 16 which may be referred to as a pre-metal dielectric (PMD). On top of the PMD layer 16 is a layer 18 including a pattern of metal conductors embedded in a dielectric 19. In the embodiment shown in the drawings, layers 16, 18 and 19 form the above-described intermediate metallization (IM), defining the transition between FEOL and BEOL portions of the die. Layer 18 is directly above the fins (i.e., no other metallization layers are present between layer 18 and the fins 13 and 14) and includes a conductor 17 that is electrically coupled to the top of the n-doped fin 13. Conductor 17 may for example be a local interconnect, connecting a source or drain of a transistor formed on the fin 13, to the gate of another transistor. The electric coupling between the conductor 17 and the fin usually includes an epi-grown contact area and possibly one or more further conductive layers such as a thin silicide layer between the conductor 17 and the fin 13, but these are not represented on the drawing in order not to complicate the drawing. On top of the layer 18, and connected to this layer 18, the BEOL portion is present in the form of a stack of interconnect levels M1, M2, M3, etc. (not shown), isolated from each other through IMD (inter metal dielectric layers), but interconnected through via connections, so that the FEOL portion 6 is connected to the metal contact areas 4 of the bonding layers 3.

The conductor 17 is not necessarily situated in a planar metallization level 18, contacting only the top of the fin 13, but it could also extend into the space in between two or more fins, contacting the fins along the top and sidewalls thereof through a so-called wrap-around contact layer on the top and sidewalls. In a general sense, the "conductor that is electrically coupled to the fin 13" as described herein may be any kind of conductor that is electrically connected to a top and/or side surface of the fin 13, possibly with an epi-grown portion and/or other conductive layers interposed between the fin and the conductor.

According to the embodiment of FIGS. 2A through 2E, and as illustrated in FIG. 2B, the etch of the TSV opening 10, from the backside of the thinned die 1, is configured to stop in the n-well 12 of the thinned die 1. The further process steps for creating the TSV are shown in FIGS. 2C through 2E. A conformal liner 20 is first deposited on the sidewalls and the bottom of the TSV opening 10. This is a dielectric material aimed at isolating the TSV from the surrounding silicon. The liner 20 may consist of or comprise $SiO_2$, SiCO, SiN, SiCN or other suitable materials, deposited for example by Atomic Layer Deposition or Chemical Vapour Deposition (CVD). At the bottom of the opening, the liner is subsequently removed (FIG. 2D). An example method for achieving this is to apply a plasma etch in an atmosphere comprising a polymer-forming component, so that a protective polymer is deposited on the upper portions of the sidewalls of the TSV opening 10 during plasma etching. The plasma etch for removal of the liner may cause a slight overetch into the n-well material, as shown in FIG. 2D.

The TSV opening is then filled with metal to form the metal-filled TSV connection, also referred to as a TSV plug 21 (FIG. 2E), by any suitable known process, that usually involves additional steps before the actual TSV metal deposition, such as a seed layer deposition, possibly a barrier layer deposition. The TSV metal is usually copper, deposited by electroplating.

The TSV plug 21 is electrically coupled to the conductor 17 of the intermediate metallization (IM) via the n-well 12 and the n-doped fin 13. The junction between the n-well 12 and the surrounding p-substrate portion 5 forms a protective diode that protects the gate dielectric of MOSFET transistors coupled to the conductor 17. The method and device of the disclosed technology thereby provide a protection against PID damage without requiring specific protection diodes in the FEOL design.

The n-well 12 may be specifically designed with regard to a particular TSV. The n-well may also be an n-well that is already included in the FEOL design.

Figure 3B:
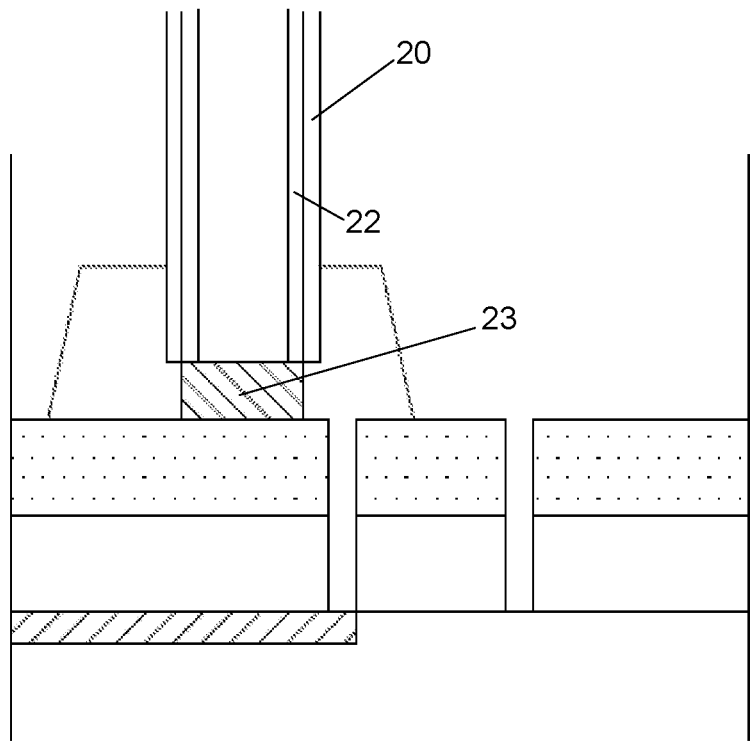

According to an embodiment of the disclosed technology, a silicide material is introduced between the bottom of the TSV opening 10 and the n-well 12, in order to ensure that a low-resistance contact is formed between the TSV plug 21 and the n-well 12. As illustrated in FIG. 3A, this may be achieved by depositing a silicide-forming metal layer 22 conformally in the TSV opening 10 after the liner deposition and after opening up of the liner 20 at the bottom. An annealing step then forms a silicide 23 at the bottom of the opening (FIG. 3B), through the silicidation reaction between the silicide-forming metal and the silicon of the n-well 12 in this area, while no reaction takes place between the layer 22 and the liner 20. Non-reacted silicide-forming material 22 may then be removed from the liner 20 on the sidewalls of the opening 10 or it may be left on the sidewalls. As the TSV plug 21 is always connected to an n-well 12, the silicide forming metal can be chosen to minimize the barrier height with respect to the electron band edge. For example, Erbium or Ytterbium are suitable silicide-forming materials.

The reference to "silicidation" implies that the semiconductor material of the substrate is silicon. However, the equivalent method step is applicable to other semiconductor materials. Generally, the method step may be described as: depositing a layer of reactive material in the opening and enabling (e.g., by annealing) a reaction between this material and the semiconductor of the well around the bottom area of the opening, i.e., the area where the liner has been removed, so as to obtain a portion of material with increased conductivity at this bottom area.

The disclosed technology is not limited to silicon dies produced on a p-substrate. The p and n doping may be reversed in the entire detailed description given above. The method is furthermore applicable to other semiconductors and to various dopant types, as long as two opposite doping types can be recognized. The n-well 12 may be obtained by implanting n-type dopants in a p-doped substrate, or by implanting n-type dopants in a p-well of a substrate. One embodiment involves production of the TSV opening 10 after bonding of the first die 1 to another die 2. However, the TSV could also be produced after bonding the first die to a temporary carrier substrate.

Figure 4:
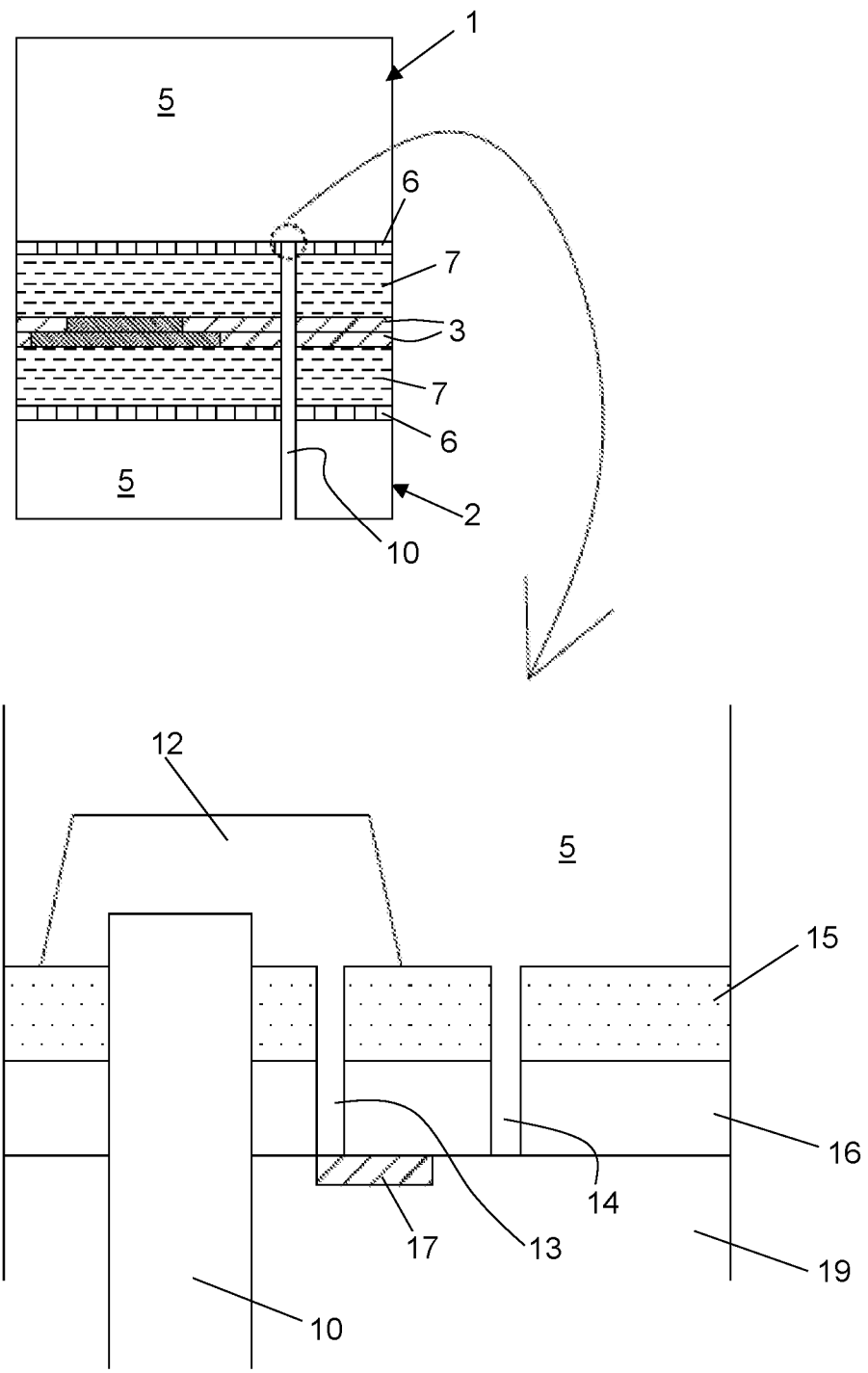
FIG. 4 illustrates an alternative process for producing a TSV in accordance with an embodiment of the disclosed technology.

While an example embodiment is as described above, i.e., the TSV opening 10 is etched through the backside of the first die 1, it is also possible to etch the opening from the opposite side of the assembly of the first and second die 1 and 2. As illustrated in FIG. 4, this requires etching through the substrate portion 5 of the second die 2, through the BEOL portion 7, the FEOL portion 6 and the dielectric bonding layer 3 of the second die 2, and through the bonding layer 3 and the BEOL portion 7 of the first die 1, stopping finally in the n-well 12 of the first die. The etch recipe of this TSV etch will be more complex compared to the first embodiment, but this second embodiment is nevertheless included in the scope of the disclosed technology.

Methods of the disclosed technology are not limited to dies bonded by hybrid bonding, but could also be applied to other bonding techniques, for example to dies bonded by microbumps on one die which are bonded to contact pads or corresponding bumps on the other die.

While embodiments of the invention have been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A method of producing a through semiconductor via (TSV) connection in a stack comprising a first semiconductor die and a second semiconductor die or a carrier substrate, the first die being bonded to the second die or to the carrier substrate, the first die comprising:
    a semiconductor substrate portion having a front side and a back side;
    on the front side of the substrate portion, at least one well of semiconductor material of a first doping type implanted in an area of the substrate portion, the area being formed of semiconductor material of a second doping type opposite the first doping type;
    one or more fins of material of the first doping type extending outward from the at least one well;
    a conductor that is electrically coupled to at least one of the one or more fins extending outward from the at least one well,
    the method comprising:
    producing an opening for the TSV connection, wherein the opening is produced by an etching process that stops in the at least one well of semiconductor material of the first type; and
    filling the opening with an electrically conductive material, wherein after filling of the opening, the TSV connection ends in the at least one well of the first die and an electrical connection is established from the TSV connection to the conductor, through the at least one well and through the at least one of the one or more fins.

2. The method according to claim 1, wherein the opening is etched through the backside of the substrate portion, after bonding the first die to the second die or to the carrier substrate.

3. The method according to claim 1, wherein the opening is etched after bonding the first die to the second die, and wherein the opening is etched through the second die.

4. The method according to claim 1, wherein the conductor is formed as a wrap-around contact layer so as to contact a top and sidewalls of the at least one fin.

5. The method according to claim 1, wherein the filling includes seed layer deposition.

6. The method according to claim 1, wherein the at least one well comprises an n-well and the at least one fin comprises an n-doped fin, and wherein the TSV connection is electrically connected to the conductor of an intermediate metallization of the first die via the n-well and the n-doped fin.

7. The method according to claim 1, wherein the at least one well comprises an n-well included in the front side of the semiconductor substrate portion.

8. The method according to claim 1, further comprising, prior to filling the opening with a conductive material:
    producing a dielectric liner on the sidewalls of the opening, followed by:
        depositing a reactive material in the opening, and
        enabling a reaction to take place between the reactive material and the semiconductor material in the at least one well, so as to form at the bottom of the opening a portion of reacted material having higher conductivity than the material of the at least one well prior to the reaction.

9. The method according to claim 8, wherein the material of the dielectric liner comprises one of $SiO_2$, SiCO, SiN, and SiCN.

10. The method according to claim 8, wherein the dielectric liner is conformally deposited with atomic layer deposition.

11. The method according to claim 8, wherein dielectric liner is removed at the bottom of the opening using a plasma etch.

12. A package of interconnected semiconductor dies, comprising at least one first die bonded to a second die, wherein at least the first die of the package comprises:
    a semiconductor substrate portion;
    at least one well of semiconductor material of a first doping type implanted in an area of the substrate portion, the area being formed of semiconductor material of a second doping type opposite the first doping type;
    one or more fins of material of the first doping type extending outward from the at least one well;
    at least one conductor that is electrically coupled to at least one of the one or more fins extending outward from the at least one well, wherein:
        the package comprises one or more TSV connections for interconnecting the dies of the package, and
        at least one TSV connection including an opening that is produced by etching that ends in the at least one well of the first die and is filled with an electrically conductive material, so that the at least one TSV connection is electrically connected to the conductor of the first die through the at least one well and through the at least one of the one or more fins.

13. The package according to claim 12, wherein the TSV connection is formed through the semiconductor substrate portion of the first die.

14. The package according to claim 12, wherein the TSV connection is formed through the second die.

15. The package according to claim 12, further comprising, at the end of the TSV connection, a portion of material having higher conductivity than the material of the at least one well.

* * * * *